United States Patent [19]

Sugawara et al.

[11] Patent Number: 5,410,159
[45] Date of Patent: Apr. 25, 1995

[54] LIGHT-EMITTING DIODE

[75] Inventors: Hideto Sugawara, Kawasaki, Japan; Kazuhiko Itaya, Goleta, Calif.

[73] Assignee: Kabushiki Kaisha Toshiba, Kawasaki, Japan

[21] Appl. No.: 128,643

[22] Filed: Sep. 30, 1993

[30] Foreign Application Priority Data

Sep. 30, 1992 [JP] Japan .................................. 4-262115

[51] Int. Cl.⁶ .................. H01L 29/205; H01L 33/00; H01S 3/19
[52] U.S. Cl. ...................................... 257/13; 257/96; 257/85; 257/97; 372/45; 372/50
[58] Field of Search ....................... 257/96, 97, 85, 13; 372/45, 50

[56] References Cited

U.S. PATENT DOCUMENTS 5,048,035  9/1991  Sugawara et al. .
5,153,889  10/1992 Sugawara et al. .
5,276,698  1/1994  Yoshida ................................. 257/45
5,296,717  3/1994  Valster ................................... 257/96

OTHER PUBLICATIONS

Tech Diz. of 13th IEEE Int. Semiconductor Laset Conf. A-5, T. Tanaka, et al. pp. 106-161 Sep. 21, 1992, Optimization of Nqw Structure in 630 nm AlGaInP Laser for High-Temperature Operation.

Primary Examiner—Jerome Jackson
Attorney, Agent, or Firm—Oblon, Spivak, McClelland, Maier & Neustadt

[57] ABSTRACT

A light-emitting diode, in which light is emitted from a side opposite to a substrate, includes a compound semiconductor substrate of a first conductivity type, a lower cladding layer formed on the substrate end consisting of InGaAlP of the first conductivity type, a light-emitting layer formed on the lower cladding layer and having a quantum well structure constituted by alternately stacking barrier layers and eight or more quantum well layers, and an upper cladding layer formed on the light-emitting layer and consisting of InGaAlP of a second conductivity type.

10 Claims, 3 Drawing Sheets

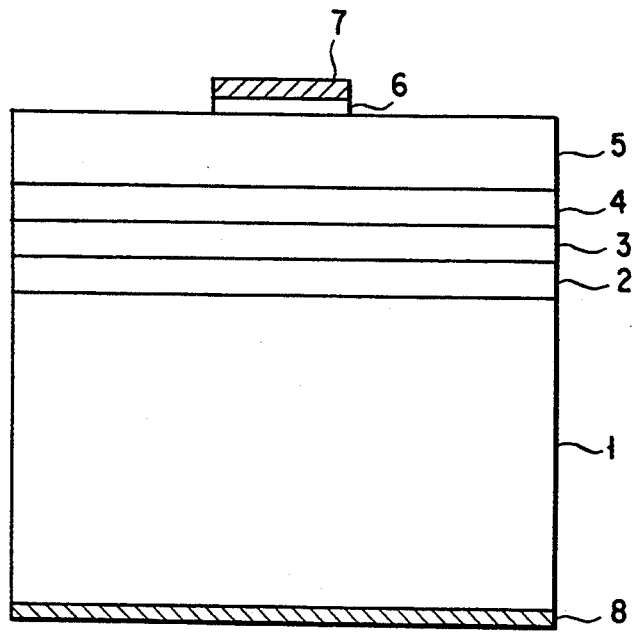
FIG. 1 (PRIOR ART)
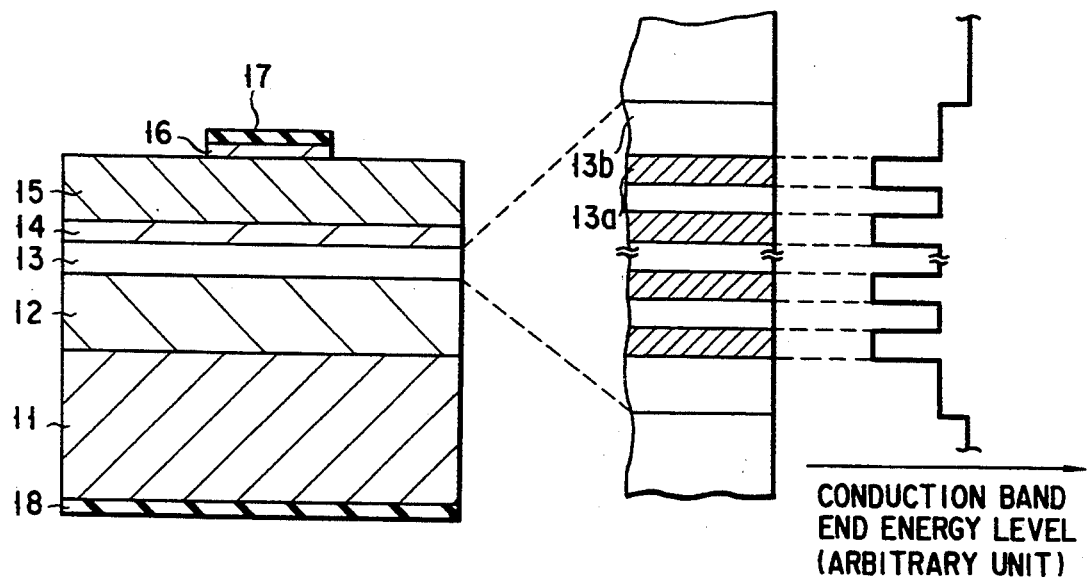
FIG. 2A
FIG. 2B

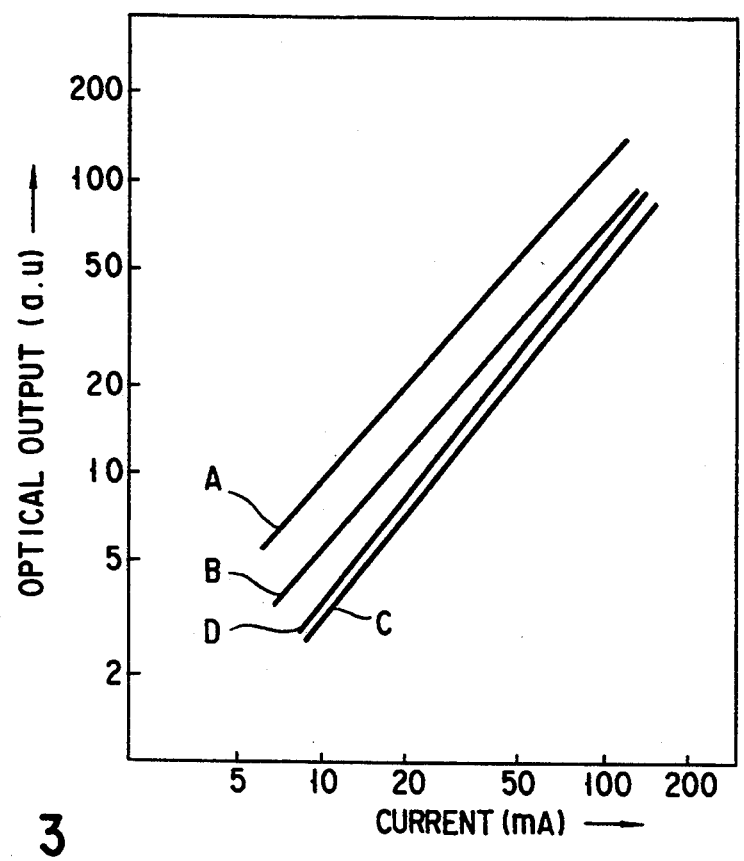
F I G. 3
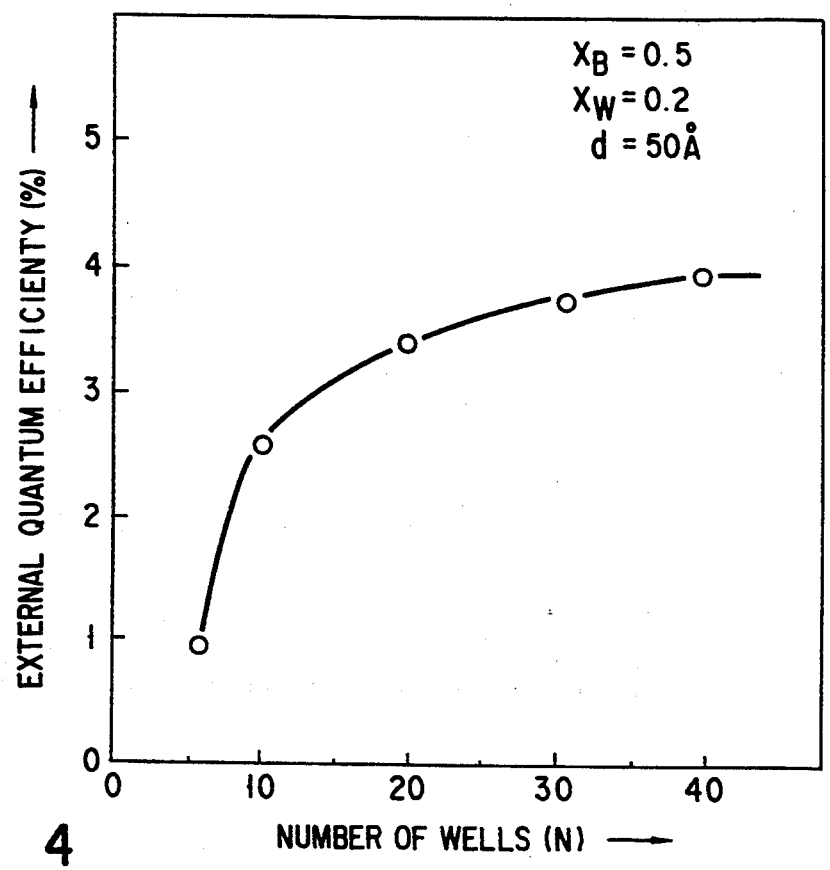
F I G. 4

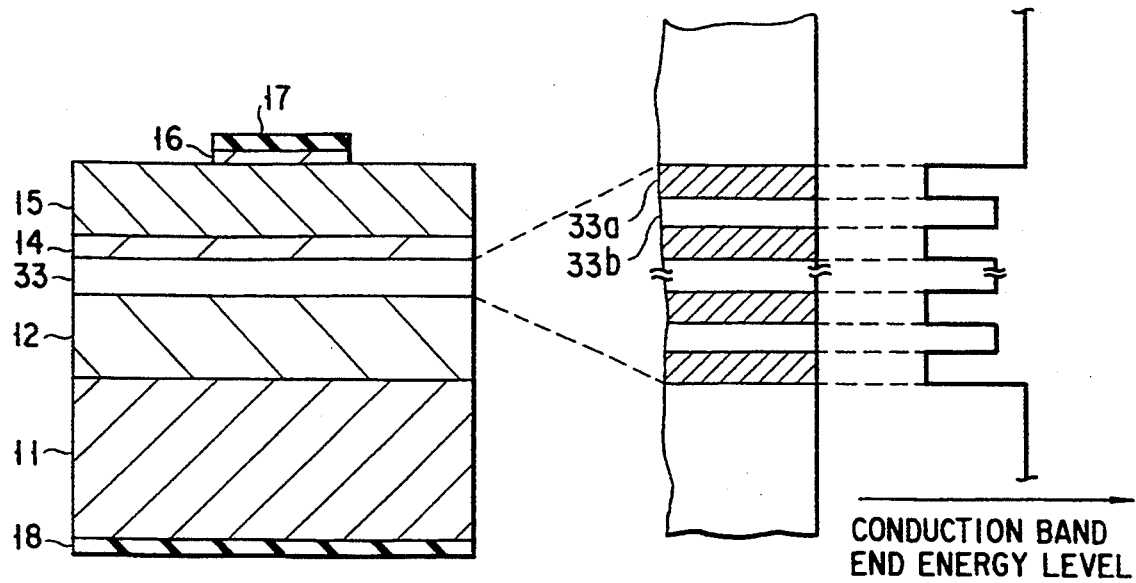
FIG. 5A
FIG. 5B
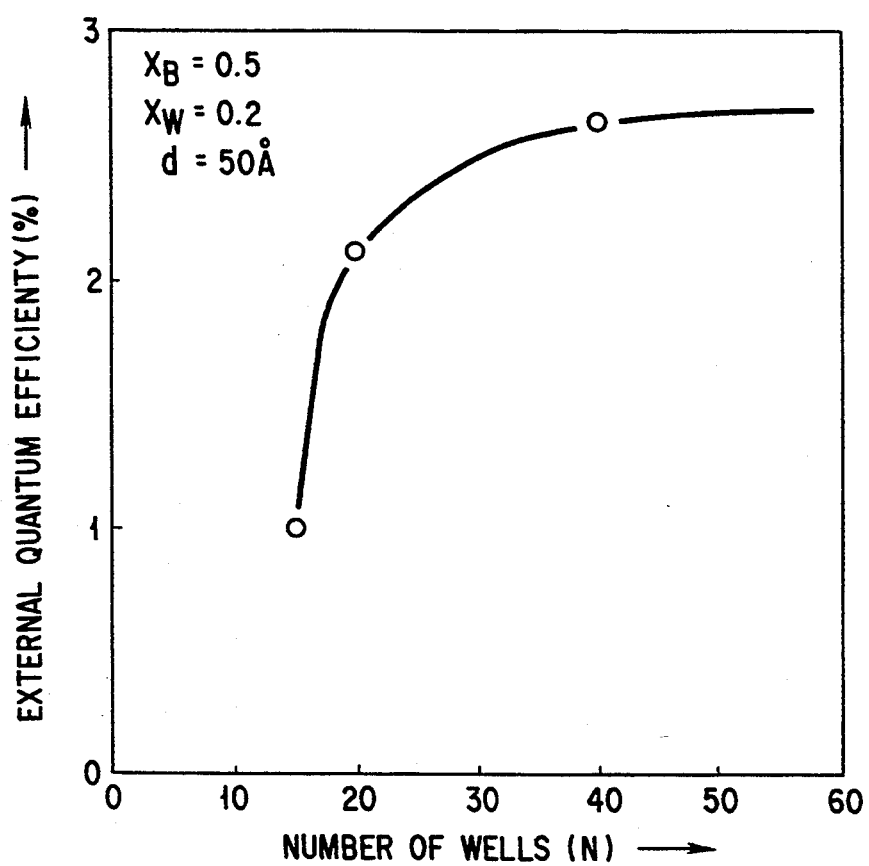
FIG. 6

LIGHT-EMITTING DIODE

BACKGROUND OF THE INVENTION

1. Field of the Invention

The present invention relates to a semiconductor light-emitting device using a compound semiconductor material and, more particularly, to a light-emitting diode using a quantum well structure in which an active region is formed as a quantum well layer.

2. Description of the Related Art

Of III–V group compound semiconductor mixed crystals except for nitrides, InGaAlP-based materials have the largest direct transition type band gap and have received a great deal of attention as light-emitting device materials in a band of 0.5 to 0.6 μm. Especially, in a p-n junction type light-emitting diode (LED), having a GaAs substrate and a light-emitting portion consisting of InGaAlP lattice-matched with GaAs, high-luminance emission can be performed in the range of red to green, as compared to a conventional LED using an indirect transition type material such as GaP or GaAsP. However, even in the LED of this type, the luminous efficiency is not sufficiently high in a shorter-wavelength region (green emission).

FIG. 1 is a sectional view showing the device structure of a conventional LED having an InGaAlP light-emitting portion. Referring to FIG. 1; a lower cladding layer 2 consisting of n-InGaAlP, an active layer 3 consisting of InGaAlP, an upper cladding layer 4 consisting of p-InGaAlP, a current diffusion layer 5 consisting of p-GaAlAs and a contact layer 6 consisting of p-GaAs are sequentially stacked on an n-GaAs substrate 1. A p-side electrode 7 consisting of AuZn, and an n-side electrode 8 consisting of AuGe, are formed on the contact layer 6 and the lower surface of the n-GaAs substrate 1, respectively.

The mixed-crystal composition is set such that the energy gap of the active layer 3, consisting of InGaAlP, becomes smaller than that of the lower or upper cladding Layer 2 or 4, and a double heterostructure is formed to confine light and carriers in the active layer 3. The composition of the current diffusion layer 5, consisting of p-GaAlAs, is set such that the current diffusion layer 5 becomes substantially transparent to the emission wavelength from the active layer 3, consisting of InGaAlP.

In the structure shown in FIG. 1, when the active layer 3 was 0.2-μm thick undoped $In_{0.5}(Ga_{1-x}Al_x)_{0.5}P$ (x=0.4), the conductivity type was an n type, and the concentration was $1 \times 10^{16}$ cm$^{-3}$ to $5 \times 10^{16}$ cm$^{-3}$. At that time, the emission wavelength was 565 nm (green), and the luminous efficiency was 0.07% at DC 20 mA. When x was 0.3, the emission wavelength was 585 nm (yellow), and the luminous efficiency was as low as 0.4% at DC 20 mA. In this case, a characteristic merit of the use of GaP- or GaAs-based material was not necessarily observed.

On the other hand, when x was 0.2, the emission wavelength was 620 nm (orange), and the luminance efficiency was 1.5% at DC 20 mA. The luminous efficiency higher than that of GaAlAs-based material could be obtained without removing the GaAs substrate 1, serving as a light-absorbing body to the emission wavelength.

As described above, the present inventors have found by experiment that the luminous efficiency is changed in accordance with the Al composition ratio x of the active layer (Appl. Phys. Lett. 58(1991)1010). That is because the influence of a non-radiative center becomes greater when the Al composition in the crystal of the active layer is increased (J. Electron Mater 20(1991)687). Under these circumstances, attempts have been made to obtain a shorter wavelength without changing the Al composition ratio while changing the degree of atomic order as a characteristic of the InGaAlP material under growth conditions.

In addition, a method of applying a quantum well (QW) structure to the active layer is regarded as a means for effectively improving the luminous efficiency in the short-wavelength region. In the QW structure, a quantum layer, having a thickness corresponding to about the wavelength or less of the wave function of the electrons, is formed between barrier layers. The barrier layer has an energy gap larger than that of the quantum well layer and serves as a barrier against the electrons in the quantum well. The QW structure is constituted by one quantum layer (SQW: Single Quantum Well) or two or more quantum layers (MQW: Multiple Quantum Well). In the semiconductor light-emitting element using the quantum well structure as the active layer, the electron state is quantized to equivalently increase the energy gap, thereby obtaining a shorter emission wavelength.

This phenomenon is essential to the quantum well structure and is also observed in other materials such as GaAlAs-based material. In application to the InGaAlP-based light-emitting element, however, the following problem is posed. In the InGaAlP-based material, a change in the band discontinuity value on the conduction band side is small when the Al composition is changed. Hence, the resultant quantum well structure has a very shallow well on the conduction band side. Consequently, the carriers (electrons) injected into the well layer overflow to the barrier layer. The Al composition ratio of the barrier layer is relatively high, and non-radiative centers are generated due to an increase in chemically active Al composition. The overflowing electrons cause a non-radiative recombination through the non-radiative centers. A deep well can be obtained by increasing the band gap of the barrier. However, this causes an increase in Al composition, resulting in the non-radiative centers being increased in the barrier layer, and thus the carrier injection efficiency is decreased.

Therefore, in order to obtain a satisfactory effect from the quantum well structure in the light-emitting element using the InGaAlP material, the structural parameters of the quantum well structure must be optimized.

As described above, in the conventional semiconductor light-emitting device having the quantum well structure type active layer consisting of InGaAlP, the injected carriers cannot be effectively confined in the well layer, and characteristics tend to deteriorate because of dislocation, defects, and non-radiative centers.

SUMMARY OF THE INVENTION

It is an object of the present invention to provide a light-emitting diode capable of improving the luminous efficiency in a light-emitting portion of a quantum well structure consisting of InGaAlP or the like, and of increasing the luminance.

The object of the present invention is to optimize the number of the quantum well layers to increase the luminous efficiency in the light-emitting portion of the quantum well structure consisting of InGaAlP material, and to optimize the Al composition ratio of the barrier layers which sandwich the quantum well layer therebetween.

According to the present invention, there is provided a light-emitting diode in which light is emitted from a side opposite to a substrate, comprising a compound semiconductor substrate of a first conductivity type, a lower cladding layer formed on the substrate and consisting of InGaAlP of the first conductivity type, a light-emitting layer formed on the lower cladding layer and having a quantum well structure constituted by alternately stacking barrier layers and eight or more quantum well layers, and an upper cladding layer formed on the light-emitting layer and consisting of InGaAlP of a second conductivity type.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a sectional view showing the element structure of a conventional LED;

FIG. 2A is a sectional view showing the element structure of an LED according to the first embodiment;

FIG. 2B is a view showing the band structure of the LED shown in FIG. 2A;

FIG. 3 is a graph for explaining the current vs. optical output characteristics of the LED according to the first embodiment and the conventional LED;

FIG. 4 is a graph showing a relationship between the number of quantum well layers and the external quantum efficiency of the LED;

FIG. 5A is a sectional view showing the device structure of an LED) according to the second embodiment;

FIG. 5B is a view showing the band structure of the LED shown in FIG. 5A; and

FIG. 6 is a graph showing a relationship between the number of quantum well layers and the external quantum efficiency of the other LED.

DETAILED DESCRIPTION OF THE PREFERRED EMBODIMENTS

The preferred embodiments of the present invention will be described below.

In the light-emitting diode of the present invention, a light-emitting layer between upper and lower cladding layers, consisting of InGaAlP, has a quantum well structure constituted by alternately stacking quantum well layers and barrier layers. In such a quantum well structure, when emission wavelength is 590 to 620 nm, the number of quantum well layers is 8 to 19, more preferably 10 to 19. When emission wavelength is less than 590, the number of quantum well layers is 20 or more, preferably 20 to 80, more preferably 20 to 40.

In the light-emitting diode of the present invention, the barrier layer of the quantum well structure constituting the light-emitting layer consists of InGaAlP. The Al composition of the barrier layer is preferably lower than that of the lower cladding layer consisting of InGaAlP of a first conductivity type and the upper cladding layer; consisting of InGaAlP of a second conductivity type.

$In_{1-y}(Ga_{1-x}Al_x)_yP$ ($0 \leq x \leq 1$ and $0 \leq y \leq 1$) can be used as the quantum well layer material, and $IN_{1-t}(Ga_{1-s}Al_s)_tP$ ($x < s \leq 1$ and $0 < t \leq 1$) can be used as the barrier layer material.

GaAs can be used as the substrate material, and $In_{0.5}(Ga_{1-u}Al_u)_{0.5}P$ lattice-matched with GaAs can be used as the cladding layer material.

The thickness of the quantum well layer is preferably set to 1 to 10 nm. At the same time, the lattice constant of the quantum well layer is preferably as small as 0 to −3%, when compared to the lattice constant of the substrate.

According to the light-emitting diode of the present invention, the concentration of carriers injected into each well layer in an element operation state can be reduced by increasing the number of the quantum well layers. Overflow of the injected carriers (overflow of the injected carriers from the active region) can be thus prevented. The overflow is caused due to a reduction in band gap difference between the quantum well layers and the cladding or barrier layers when the quantum well structure is used to equivalently increase the energy gap. The frequency of recombination between the injected carriers in the overflow region can be reduced, thereby effectively confining the injected carriers to the well.

If the Al composition of the barrier layer is reduced to decrease the non-radiative centers in the layer, the frequency of recombination between the carriers overflowing from the well to the barrier layer can be further reduced. If a multiple quantum well structure having many layers is used, the carriers can be smoothly injected into each well layer and a quantum well structure having a high luminance efficiency can be realized, thereby obtaining a light-emitting element with a high luminance.

To obtain the above-described effect in the present invention, each parameter of the quantum well structure must satisfy the following relationship.

$$N \geq 20/d\{0.2(X_B - X_W) - \tfrac{1}{2}d\} \quad (1)$$

$$N \geq 50/d\{0.2(X_B - X_W) - \tfrac{1}{2}d\} \quad (2)$$

This relationship represents an optimal condition for obtaining a high luminance efficiency, obtained from the experimental results of extensive studies by the inventors, based on the relationship between the depth of the quantum well on the conduction band side and the energy state of the electrons injected into each well layer.

In inequalities (1) and (2), N represents the number of quantum well layer d; the thickness of the quantum well layer (angstrom) $X_B$; the Al composition of the barrier layer and $X_W$; the Al composition of the quantum well layer. Term $0.2(X_B - X_W)$ represents an amount equivalent to the depth of the well on the conduction band side, and term $\tfrac{1}{2}d$ approximately represents an amount equivalent to the energy on the conduction band side, which changes in accordance with the quantum effect.

Therefore, term $\{0.2(X_B-X_W)-\frac{1}{2}d\}$ is equivalent to the effective depth of the well against the electrons. N×D is the total thickness of the well layers and determines the energy state of the injected electrons.

(1) Emission wavelength: 590 to 620 nm (orange-grape)

The constant of 20 of the numerator on the righthand side, of equality (1), was obtained from the experiments as a condition to increase the luminance efficiency of the LED.

when emission wavelength is 600 nm, following values are typical.

d=5 nm
$X_B=0.5$
$X_W=0.2$

Substitutions of these typical values into parameters in inequality (1) yielded N≧8, where N is the total number of quantum well layers. N≧10 was obtained as a condition to obtain a sufficiently high luminance efficiency (external quantum efficiency was 2.5% or more).

(2) Emission wavelength: less than 590 nm (green-blue-ultraviolet)

The constant of 50, of the numerator on the righthand side, of inequality (2), was obtained from the experiments as a condition to increase the luminance efficiency of the LED.

When emission wavelength is 575 nm, following values are typical.

d=5 nm
$X_B=0.6$
$X_W=0.3$

Substitutions of these typical values into parameters in inequality (1) yielded N≧20, where N is the total number of quantum well layers.

The embodiments of the present invention will be described below with reference to the accompanying drawings to embody the present invention in more detail.

FIG. 2A is a sectional view showing the schematic structure of a light-emitting diode (LED), according to the first embodiment of the present invention. Referring to FIG. 2A, reference numeral 11 denotes an n-GaAs substrate. A light-emitting portion constituted by a lower cladding layer 12, consisting of n-$In_{0.5}(Ga_{1-z}Al_z)_{0.5}P$, a quantum well structure type active layer 13 and an upper cladding layer 14, consisting of p-$In_{0.5}(Ga_{1-u}Al_u)_{0.5}P$, is grown on one major surface of the substrate 11.

A current diffusion layer 15, consisting of p-$Ga_{1-w}Al_wAs$, and a contact layer 16, consisting of p-GaAs, are grown on the light-emitting portion. The contact layer 16 is selectively etched into, e.g., a circular shape. A p-side electrode 17, consisting of Au-Zn, is formed on the contact layer 16, and an n-side electrode 18, consisting of Au-Ge, is formed on the other major surface of the substrate 11. All the layers are formed by using the metal-organic chemical vapor deposition (MOCVD) method.

The quantum well structure type active layer 13 is constituted by alternately stacking a plurality of quantum well layers 13a and barrier layers 13b, as shown in FIG. 2B. The quantum well layer 13a consists of $In_{1-y}(Ga_{1-x}Al_x)_yP$ (0≦x≦1 and 0≦y≦1), and the barrier layer 13b consists of $In_{1-t}(Ga_{1-s}Al_s)_tP$ (x<s≦1 and 0<t≦1). Although the above structure is basically the same as that of the conventional device, the structure in this embodiment is characterized in that the number of the quantum well layers 13a is as many as 8 or more.

An example, in which the above described quantum well structure type active layer portion is applied to the surface emission type LED shown in FIG. 2A, will be described below.

The quantum well structure active layer 13a consists of $In_{0.5}(Ga_{0.8}Al_{0.2})_{0.5}P$, having a thickness of 4 nm (20 layers), the barrier layer 13b consists of $In_{0.5}(Ga_{0.5}Al_{0.5})_{0.5}P$ (the thickness of the layer between the quantum wells is 5 nm; the thickness of layers adjacent to the lower and upper cladding layers 12 and 14 is 50 nm), the lower cladding layer 12 consists of n-$In_{0.5}(Ga_{0.3}Al_{0.7})_{0.5}P$, and the upper cladding layer 14 consists of p-$In_{0.5}(Ga_{0.3}Al_{0.7})_{0.5}P$. The current diffusion layer 15 consists of p-$Ga_{0.3}Al_{0.7}As$ having a thickness of 7 μm. Zn is used as a p-type impurity doped in the lower and upper cladding layers 12 and 14, and the current diffusion layer 15, and the concentration is $3 \times 10^{17}$ cm$^{-3}$ for the upper cladding layer 14, and $3 \times 10^{18}$ cm$^{-3}$ for the current diffusion layer 15. Si is used as an n-type impurity, and the concentration is about $3 \times 10^{17}$ cm$^{-3}$ for the lower cladding layer 12.

FIG. 3 shows the current vs. optical output characteristics of the LED. Referring to FIG. 3, lines A, B and represent the current vs. optical output characteristics of the LED (device A, B and C) having the quantum well structure of this embodiment in which the number of the quantum well layers 13a is 20, 10, and 5. A line D represents the current vs. optical output characteristics of the LED having the conventional structure shown in FIG. 1, in which the Al content of the active layer 3 consisting of InGaAlP is given as 0.3 (device D).

The emission wavelengths of the four elements shown in FIG. 3 were substantially the same; at about 595 nm. As for the elements: having the quantum well structures, when the number of layers of the quantum well was increased, the optical output was increased. Comparing the optical output of the device A, having 20 quantum well layers to that of the device D, having the conventional structure (bulk active layer) at the operating current of 20 mA; the device having the quantum well structure obtained on optical output about 2.5 times that of the conventional device. In the device A, having the quantum well structure constituted by 20 quantum well layers, a high luminance efficiency in which the external quantum efficiency exceeded 3% at 20 mA was obtained.

The gradients of the current vs. optical output characteristics shown in FIG. 3 are changed due to the influence of the non-radiative centers. The closer the gradient comes to 2; the more the influence is increased. The closer the gradient comes to 1; the more the influence is reduced (J. Electron. Master. 20(1991)687). The gradients of the lines A, B and C are 1.08, 1.11 and 1.21 in the order described. As the number of quantum wells is increased, the gradient becomes smaller, and the influence of the non-radiative centers is reduced. This is because the overflow of the injected carriers is prevented by an increase in the number of wells which effectively confines the carriers, and non-radiative recombination between carriers, due to the high Al composition in the barrier or cladding layer, is reduced.

FIG. 4 shows an example of the relationship between the number of well layers and the external quantum efficiency of the LED. The Al content of the barrier layer is given as 0.5, the Al content of the well layer is given as 0.2, and the width of the well is given as 5 nm. The number of wells obtained from the above inequality, as a condition, is eight or more. As shown in FIG.

4, when the number of wells is eight or more, a high efficiency of 2% or more can be obtained. In addition, when the number of wells is 20 or more, a high efficiency of 3% or more can be obtained with good reproducibility. When emission wavelength is 590 to 620 nm (orange-grape), more preferable relationship is represented by $$N \geq 40/d\{0.2(X_B - X_W) - 1/d\} \quad (3)$$

In FIG. 4, when the number of wells exceeds five, the external quantum efficiency is rapidly increased. When the number of wells exceeds 10, the ascending curve of the external quantum efficiency is moderated. On the other hand, an increase in the number of wells causes an increase in interface adversely affecting reliability. When the thickness of a light-emitting layer (well layer+barrier layer) becomes too thick to exceed the coherent length of the electrons, the luminance efficiency is decreased. The number of wells is preferably about 80 or less since a saturation tendency is observed when the number of layers reaches 40. By changing the parameters such as the Al composition of the well or barrier layer and the width of the well, the characteristic curve in FIG. 4 is changed according to inequalities (1), (2) and (3). However, in the range in which the quantum well structure is generally used, the region where the external quantum efficiency starts to increase is slightly shifted. Therefore, the satisfactory number of wells is eight to 80. A high luminance efficiency which cannot be obtained in any conventional element can be obtained, thus proving a great advantage.

There will now be described LED having more short emission wavelength. In this LED, the active layer having a quantum well structure is constituted by 20 layers of $In_{0.5}(Ga_{0.7}Al_{0.3})_{0.5}P$ each layer having a thickness of 5 nm, the barrier layer 13b is constituted by $In_{0.5}(Ga_{0.7}Al_{0.3})_{0.5}P$ (the thickness is the same as abovementioned value). The other conditions (thickness of each layer, carrier concentration) are the same as those described above. The LED have the emission wavelength of 580 nm and a high luminous efficiency in which the external quantum efficiency exceeds at 20 mA.

FIG. 6 shows the relation between a number of wells and the external quantum efficiency in the LED. The number of wells is determined from the above-described inequality to 33 or more. As shown in FIG. 6, when the number of wells is 20 or more, a high efficiency of 2% or more can be obtained. For that reason, when the number of wells is 20 or more in the device having a short emitting wavelength (590 nm or less), a high external quantum efficiency can be obtained. In addition, when the number of wells is more increased, a saturation tendency occurs for the same reason as that of the above-described device.

FIG. 5A is a sectional view showing the schematic structure according to the second embodiment of the present invention. The same reference numerals as in FIG. 2A denote the same parts in FIG. 5A, and a detailed description thereof will be omitted.

The second embodiment is different from the first embodiment in that the barrier layer 13, adjacent to the p- and n-cladding layers 14 and 12, is eliminated. More specifically, as shown in FIG. 5B, in an active layer 33, between the lower and upper cladding layer 12 and 14, having a quantum well structure constituted by alternately stacking a plurality of quantum well layers 33a and barrier layers 33b, the quantum well layers 33a are formed at positions adjacent to the lower and upper cladding layers 12 and 14, respectively. Other conditions (e.g., the thickness of each layer and the carrier concentration) are the same as those in the first embodiment.

With this structure, a non-radiative recombination between the overflowing injected carriers, at the barrier layers 33b adjacent to the lower and upper cladding layers 12 and 14, can be prevented, thereby obtaining a higher luminance efficiency than that of the first embodiment.

The present invention is not limited to the above embodiments. In the above embodiments, all the crystal growth layers constituting the elements are grown by matching the lattice constants with the substrate crystals. However, the same effect can be obtained in a structure using lattice-mismatching. In addition, lattice-mismatching is given in a direction which causes a tensile strain to act on the quantum well layers of the quantum well structure active layer portion, thereby increasing the energy levels of the conduction band ends between the barrier layers and the quantum well layers which effectively confines the injected carriers.

Furthermore, when a distortion is caused due to lattice-nonmatching, the energy difference between the band end having a small effective mass of holes, in the planar direction of the quantum well, and that having the large effective mass thereof causes a difference in the injected carrier concentration and the operating temperature. In such a lattice-nonmatching structure, as a material constituting the quantum well structure portion; not only InGaAlP, but also InGaAsP can be applied. In addition, any direct transition type compound semiconductor, which changes its lattice constant in accordance with composition, can also be used.

The present invention is not limited to the light-emitting diode, but can also be applied to a surface emission type laser. Various changes and modifications can be made without departing from the spirit and scope of the invention.

As has been described above, according to the present invention, in the light-emitting diode, formed on the compound semiconductor substrate, having a light-emitting portion consisting of InGaAlP or the like, the light-emitting portion is constituted as a quantum well structure. The number of quantum wells is preferably eight or more, more preferably 10 or more, and most preferably 17 or more. The Al composition ratio of the barrier layer is set lower than that of the cladding layer. The injected carriers, therefore, can be effectively confined, and a non-radiative recombination between the carriers outside the quantum well layer can be prevented, thereby realizing the light-emitting diode capable of obtaining a high luminance efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light-emitting diode comprising:
   a compound semiconductor substrate of a first conductivity type;

a lower cladding layer formed on said compound semiconductor substrate and essentially consisting of InGaAlP of said first conductivity type;

a light-emitting layer formed on said lower cladding layer and having a quantum well structure constituted by alternately stacking barrier layers and 10 to 19 quantum well layers; and and upper cladding layer formed on said light-emitting layer and essentially consisting of InGaAlP of a second conductivity type, wherein light having emission wavelengths in the range of 590 to 620 nm is emitted from said light-emitting diode.

2. A light-emitting diode according to claim 1, wherein said barrier layers essentially consist of InGaAlP, and an Al content of said barrier layers is lower than that of said upper and lower cladding layers which essentially consist of InGaAlP of said first and second conductivity types.

3. A light-emitting diode according to claim 1, wherein said quantum well layers essentially consist of $IN_{1-y}(Ga_{1-x}Al_x)_yP$ ($0 \leq x \leq 1$ and $0 \leq y \leq 1$), and said barrier layers essentially consist of $IN_{1-t}(Ga_{1-s}Al_s)_tP$ ($x < s \leq 1$ and $0 < t \leq 1$).

4. A light-emitting diode according to claim 1, wherein said compound semiconductor substrate essentially consists of GaAs, and said upper and lower cladding layers essentially consist of $In_{0.5}(Ga_{1-u}Al_u)_{0.5}P$, lattice-matched with GaAs.

5. A light-emitting diode according to claim 1, wherein a thickness of each of said quantum well layers is 0 to −3% smaller than that of said compound semiconductor substrate.

6. A light-emitting diode comprising:

a compound semiconductor substrate of a first conductivity type;

a lower cladding layer formed on said compound semiconductor substrate and essentially consisting of InGaAlP of said first conductivity type;

a light-emitting layer formed on said lower cladding layer and having a quantum well structure constituted by alternately stacking barrier layers and 20 to 80 quantum well layers; and and upper cladding layer formed on said light-emitting layer and essentially consisting of InGaAlP of a second conductivity type, wherein light having emission wavelengths in the range of 590 to 620 nm is emitted from said light-emitting diode.

7. A light-emitting diode according to claim 6, wherein said barrier layers essentially consist of InGaAlP, and an Al content of said barrier layers is lower than that of said upper and lower cladding layers which essentially consist of InGaAlP of said first and second conductivity types.

8. A light-emitting diode according to claim 6, wherein said quantum well layers essentially consist of $IN_{1-y}(Ga_{1-x}Al_x)_yP$ ($0 \leq x \leq 1$ and $0 \leq y \leq 1$), and said barrier layers essentially consist of $IN_{1-t}(Ga_{1-s}Al_s)_tP$ ($x < s \leq 1$ and $0 < t \leq 1$).

9. A light-emitting diode according to claim 6, wherein said compound semiconductor substrate essentially consists of GaAs, and said upper and lower cladding layers essentially consist of $In_{0.5}(Ga_{1-u}Al_u)_{0.5}P$, lattice-matched with GaAs.

10. A light-emitting diode according to claim 6, wherein a thickness of each of said quantum well layers is 0 to −3% smaller than that of said compound semiconductor substrate.

* * * * *